United States Patent [19]

Jain et al.

[11] Patent Number: 5,741,626

[45] Date of Patent: Apr. 21, 1998

[54] METHOD FOR FORMING A DIELECTRIC TANTALUM NITRIDE LAYER AS AN ANTI-REFLECTIVE COATING (ARC)

[75] Inventors: Ajay Jain; Kevin Lucas, both of Austin, Tex.

[73] Assignee: Motorola, Inc., Schaumburg, Ill.

[21] Appl. No.: 632,209

[22] Filed: Apr. 15, 1996

[51] Int. Cl.$^6$ .................... G03F 7/00; H01L 21/314
[52] U.S. Cl. .................... 430/314; 430/311; 430/312; 430/316; 430/317; 438/626; 438/633; 438/634; 438/636; 438/692; 438/694; 438/703; 438/785; 216/18
[58] Field of Search .................... 430/311, 312, 430/314, 316, 317; 156/652.1, 661.11; 437/229, 195; 216/18; 438/598, 626, 634, 636, 637, 638, 618, 703, 692, 694, 126, 133, 355, 389, 785, 633

[56] References Cited

U.S. PATENT DOCUMENTS

| | | | |
|---|---|---|---|
| 3,884,698 | 5/1975 | Kakihama et al. | 117/217 |
| 4,374,912 | 2/1983 | Kaneki et al. | 430/5 |
| 4,804,606 | 2/1989 | Ohno et al. | 430/57 |
| 5,091,244 | 2/1992 | Biornard | 428/216 |
| 5,451,543 | 9/1995 | Woo et al. | 438/637 |
| 5,635,423 | 6/1997 | Huang et al. | 438/638 |

FOREIGN PATENT DOCUMENTS

| | | | |
|---|---|---|---|
| 0661736A1 | 7/1995 | European Pat. Off. | |
| 60-32980 | 2/1985 | Japan | F03G 7/06 |
| 60-55657 | 3/1985 | Japan | H01L 27/04 |
| 63-76325 | 4/1988 | Japan | H01L 21/30 |
| 4-124869 | 4/1992 | Japan | H01L 27/04 |

OTHER PUBLICATIONS

Dan C. Anderson et al., "The Great Static Protection Debate", Australian Electronics Engineering 17(10):52–5 Oct. 1984, 5 pgs.

Yasushiro Fukuda et al., "Electrical Overstress/Electrostatic Discharge", VLSI ESD Phenomenon and Protection—1988 EOS/ESD Symposium Proceedings, pp. 228–234.

"Dual Damascene: A ULSI Wiring Technology," Kaanta, et al.; VMIC Conference, Jun. 11, 1991.

"Chemical Vapor Deposition of Vanadium, Niobium, and Tantalum Nitride Thin Films," Fix, et al.; Chem. Mater, vol. 5, No. 5, 1993.

Primary Examiner—Bernard P. Codd
Attorney, Agent, or Firm—Keith E. Witek

[57] ABSTRACT

The present invention provides an anti-reflective $Ta_3N_5$ coating which can be used in a dual damascene structure and for I line or G line lithographies. In addition, the $Ta_3N_5$ coating may also be used as an etch stop and a barrier layer. A dual damascene structure is formed by depositing a first dielectric layer (16). A dielectric tantalum nitride layer (18) is deposited on top of the first dielectric layer. A second dielectric layer (20) is deposited on the tantalum nitride layer. A dual damascene opening (34) is etched into the dielectric layers by patterning a first opening portion (26) and a second opening portion (32) using photolithography operations. Dielectric tantalum nitride layer (18) serves as an ARC layer during these operations to reduce the amount of reflectance from conductive region (14) to reduce distortion of the photoresist pattern. The use of a dielectric tantalum nitride layer as an ARC is particularly suitable for I line and G line lithography.

27 Claims, 6 Drawing Sheets

5,741,626

1

METHOD FOR FORMING A DIELECTRIC TANTALUM NITRIDE LAYER AS AN ANTI-REFLECTIVE COATING (ARC)

FIELD OF THE INVENTION

The present invention relates to semiconductor devices in general, and more particularly to semiconductor devices having anti-reflective coatings to aid in photolithography steps, such as those used to form in a dual damascene interconnect structure.

BACKGROUND OF THE INVENTION

The semiconductor industry's continuing drive toward integrated circuits with ever decreasing geometries, coupled with its pervasive use of highly reflective materials, such as polysilicon, aluminum, and metal silicides, has lead to increased photolithographic patterning problems. Unwanted reflections from these underlying reflective materials during the photoresist patterning process often cause the resulting photoresist patterns to be distorted.

Anti-reflective coatings (ARCs) have been developed to minimize the adverse impact due to reflectance from these reflective materials. In many instances, these ARCs are conductive materials which are deposited as a blanket layer on top of metal and simultaneously patterned with the metal to form interconnects. A problem with these ARCs is that many of these materials cannot be used in applications such as dual damascene, wherein the metal layer is not patterned. In a dual damascene application, openings are formed in the interlayer dielectric, and the metal is blanketly deposited in those openings and subsequently polished back to form a planar inlaid plug. In such application, the metal layer is never etched and therefore, any conductive ARC on top of the inlaid metal would cause the metal plugs to be electrically short circuited together through the conductive ARC.

Some dielectric ARCs are also known, such as silicon rich silicon nitride or aluminum nitride, but a disadvantage with these ARCs is that they are most suitable for deep ultraviolet (DUV) radiation, whereas a vast majority of photolithography steps occur at higher wave lengths such as I-line or G-line where these ARCs are not optimal.

Accordingly, there is a need for an improved semiconductor manufacturing operation which utilizes an anti-reflective coating that is applicable to the more prevalent I-line or G-line lithographies and which can be used in applications, such as dual damascene, which require ARCs that are nonconductive and potentially used as a damascene etch stop layer.

2 of a dual damascene structure in accordance with an alternative embodiment of the present invention.

Figure 13:
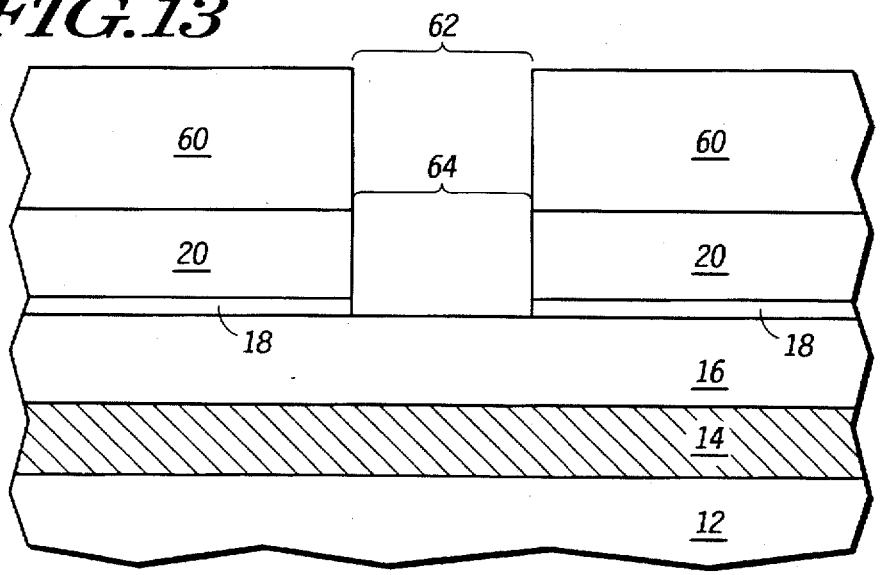
Figure 14:
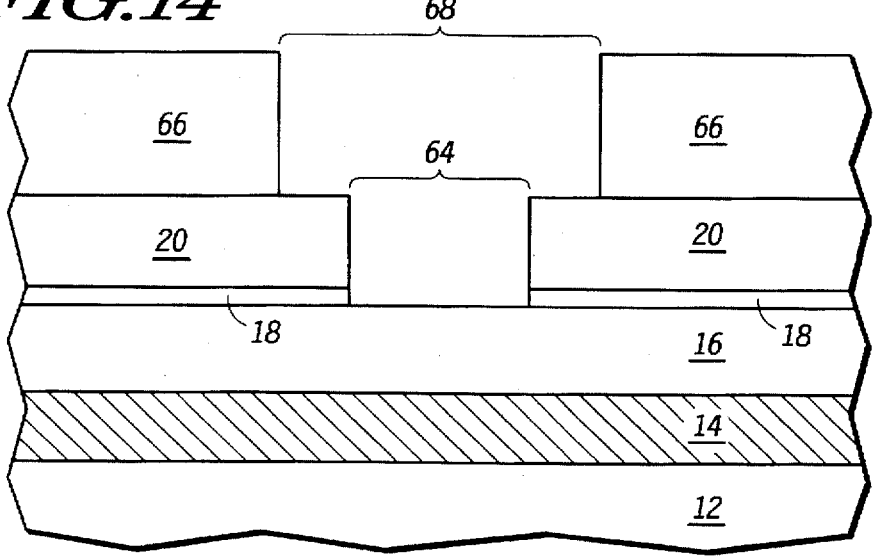
Figure 15:
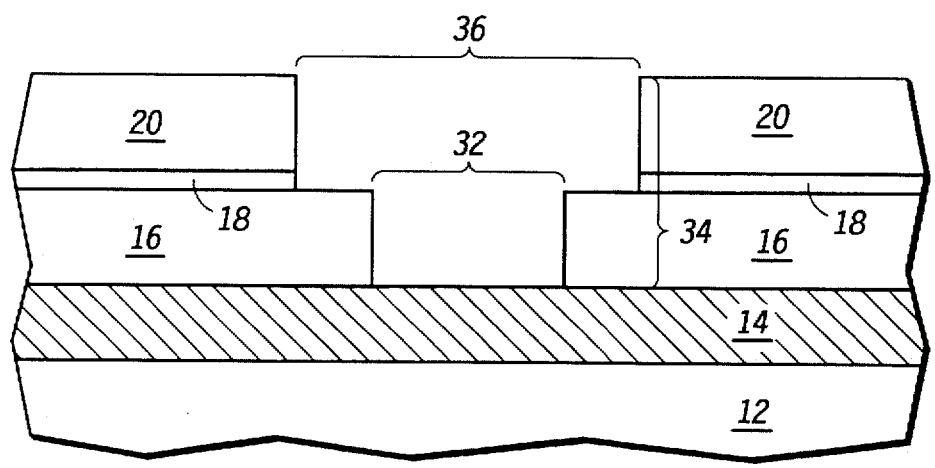

FIGS. 13–15 illustrate in cross-section an alternative process which may be used to form a dual damascene structure having an ARC layer in accordance with the present invention.

DETAILED DESCRIPTION OF A PREFERRED EMBODIMENT

Generally, the present invention involves using a dielectric phase of tantalum nitride ($Ta_3N_5$)in conjunction with damascene or dual inlaid metalization processing. Specifically, a conductive region is provided overlying the surface of a semiconductor wafer. A damascene-type contact is etched to expose the conductive region. The damascene process typically involves deposition of two dielectric layers with a silicon nitride (PEN) in the middle as an etch stop material. In one form, an opening with a small width (via) is formed using the PEN as an etch stop, followed by a formation of a larger opening (interconnect trench). The photolithographic processing used to form this damascene contact would be benefited by the use of an antireflective coating (ARC) layer. In order to reduce reflected light, reduce destructive and constructive interference from reflective light, and reduce adverse effects of light reflection during photoresist processing, a tantalum nitride dielectric layer ($Ta_3N_5$)is formed overlying the patterned inlaid conductive region to function as an anti-reflective coating (ARC).

The use of this dielectric phase tantalum nitride ARC layer provides several advantages. First, the tantalum nitride ARC layer made of $Ta_3N_5$ has superior light absorption qualities beyond other known ARC layers when I line photo processing is used. In addition, the dielectric phase of tantalum nitride ($Ta_3N_5$)is non-conductive and will therefore not produce electrical short circuits of the inlaid damascene structure. In addition, the $Ta_3N_5$ dielectric ARC layer may be deposited between the two dielectric layers (or oxide layers) to replace the PEN layer so that the tantalum nitride ARC layer can serve the dual purpose of being an anti-reflective coating and being an etch stop layer used to form the damascene contact. In addition, the $Ta_3N_5$ coating may be deposited directly on top of the underlying conductive region as a barrier layer which prevents atoms of copper or like atoms from diffusing into adjacent dielectric regions.

The use of a dielectric tantalum nitride layer as an ARC coating/etch stop layer/barrier material can be better understood with reference to FIGS. 1–12.

Figure 1:
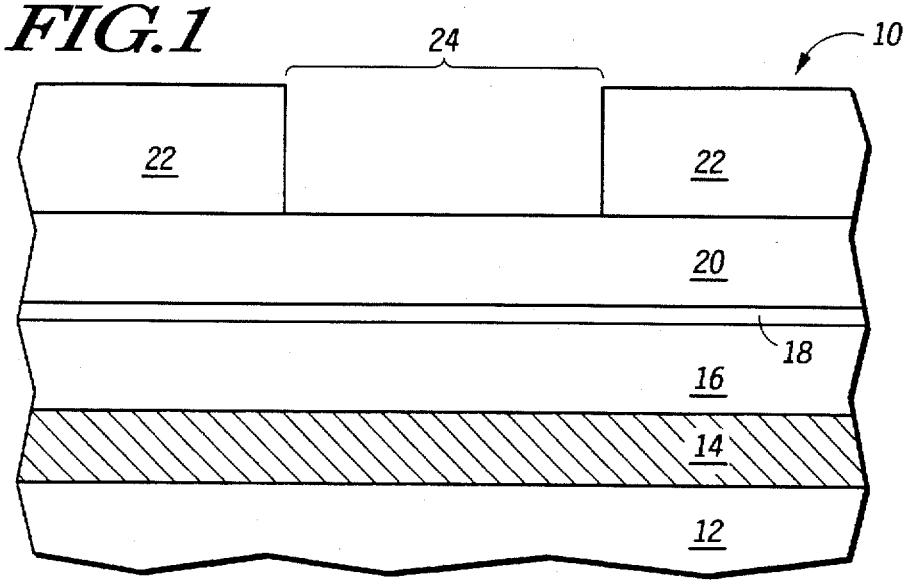
FIGS. 1–5 illustrate in cross-section a portion of a semiconductor device having a dual damascene structure utilizing an anti-reflective coating in accordance with one embodiment of the present invention.

FIGS. 1–5 illustrate a method for forming a semiconductor structure 10 using a dielectric phase tantalum nitride ($Ta_3N_5$) anti-reflective coating (ARC) layer. In FIG. 1, a semiconductor substrate 12 is provided. Typically, the anti-reflective layer processing taught herein is performed between conductive layers of an integrated circuit which may comprise one or more layers of polysilicon, amorphous silicon, silicides, salicides, metal regions, refractory metals, and the like. Therefore, semiconductor substrate 12 not only includes a semiconductor wafer portion, but may also include a plurality of dielectric and conductive layers as are necessary to form active devices on a semiconductor substrate. A conductive region 14 is formed overlying the semiconductor substrate 12 which contains the active circuitry (not specifically illustrated in FIG. 1). The conductive region 14 is used to electrically connect one active element in the substrate 12 to one or more other active element in the substrate 12 as is known in the art. Conductive region 14 is preferably made of 99% aluminum with a remainder of the material comprising copper. In another form, the conductive region 14 may be copper, polysilicon, gold, or any like conductive layer which has a surface that is reflective to light during photolithography processing. The layer 14 may be formed by a damascene process or may be patterned and etched using conventional photolithography and etch technology.

A first dielectric layer 16 is deposited over the conductive region 14. In a preferred form, dielectric layer 16 is a tetraethelorthosilicate (TEOS) layer. A dielectric tantalum nitride layer $Ta_3N_5$ is deposited overlying the first dielectric layer 16. In a preferred form, the layer 18 is deposited having a thickness of 100 angstroms to 1000 angstroms, however, any thickness of layer 18 will provide at least some anti-reflective properties. A second dielectric layer 20 is then deposited over the dielectric tantalum nitride layer 18. In a preferred form, the second dielectric layer 20 is a TEOS dielectric layer.

In FIG. 1, a photoresist material 22 is formed overlying the second dielectric layer 20. A portion of the photoresist 22 is exposed to light or some radiation while other portions of the photoresist 22 are shielded or masked from exposure to the light. Typical wavelengths of light used for this exposure process is a wavelength selected from the range of 200 nanometers to 440 nanometers. When this light is selectively exposed to photoresist layer 22, the light passes through layer 22, through layer 20, and will encounter the anti-reflective coating dielectric tantalum nitride layer 18. The dielectric tantalum nitride layer 18 will attenuate (via absorption of energy) some of the light passing through layer 18 and will also phase shift some of the light through layer 18 so that reflection off a surface of layer 14 will not adversely impact the light exposure and subsequent development of portions of the photoresist 22. Due to the presence of layer 18, the dimensions of various openings through the photoresist 22 are rendered more controllable and an opening 24 can be developed through photoresist 22 in a manner that is much more manufacturable than openings which are manufactured using no anti-reflective coating layer. Therefore, FIG. 1 illustrates an opening 24 which is superior to other openings formed in the prior art due to the presence of the ARC dielectric tantalum nitride layer 18.

It is important to note that the attenuation properties of the $Ta_3N_5$ dielectric tantalum nitride layer 18 is maximized at a wavelength of roughly 300 nanometers. Optimal attenuation of reflection is also achieved when the thickness of the dielectric tantalum nitride layer 18 is between 100 angstroms and 1000 angstroms. An optimal thickness being roughly 500 angstroms in most circumstances. Therefore, the dielectric tantalum nitride layer 18 is a superior anti-reflective coating layer when used for I line processing and other photolithographic processing involving light exposure in the vicinity of 300 nanometers.

Figure 2:
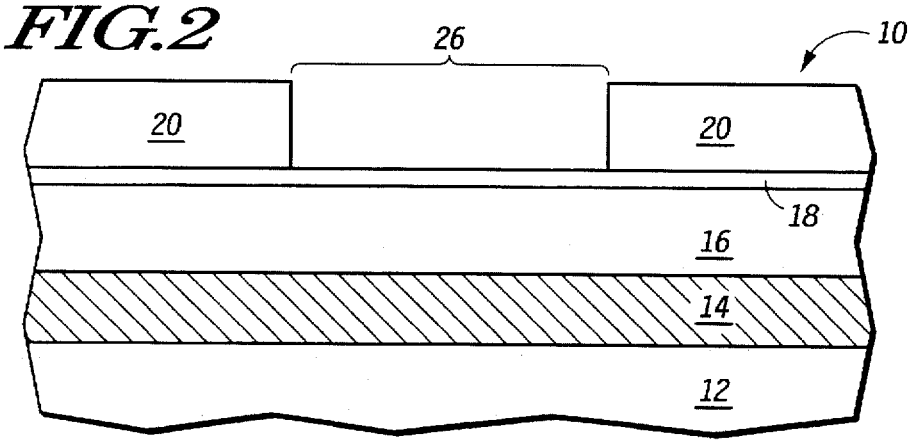

FIG. 2 illustrates that the opening 24 in the photoresist layer 22 is extended through the second dielectric layer 20 to form a first portion 26 of a contact opening. The chemistry used to etch the opening 26 in second dielectric layer 22 is selective to the layer 18. Therefore, the dielectric tantalum nitride layer 18 functions as an etch stop for the etching process used to form the opening 26. In FIG. 2, the photoresist 22 is illustrated as being removed from the semiconductor structure 10 after formation of the opening 26. While this photoresist removal is performed in FIG. 2 in a preferred method, in another form, photoresist 22 may remain on the surface of the semiconductor structure 10 and be removed subsequently with photoresist 28 of FIG. 3. The dielectric tantalum nitride layer is preferably etched via a plasma fluorine chemistry ($CF_4$).

Figure 3:
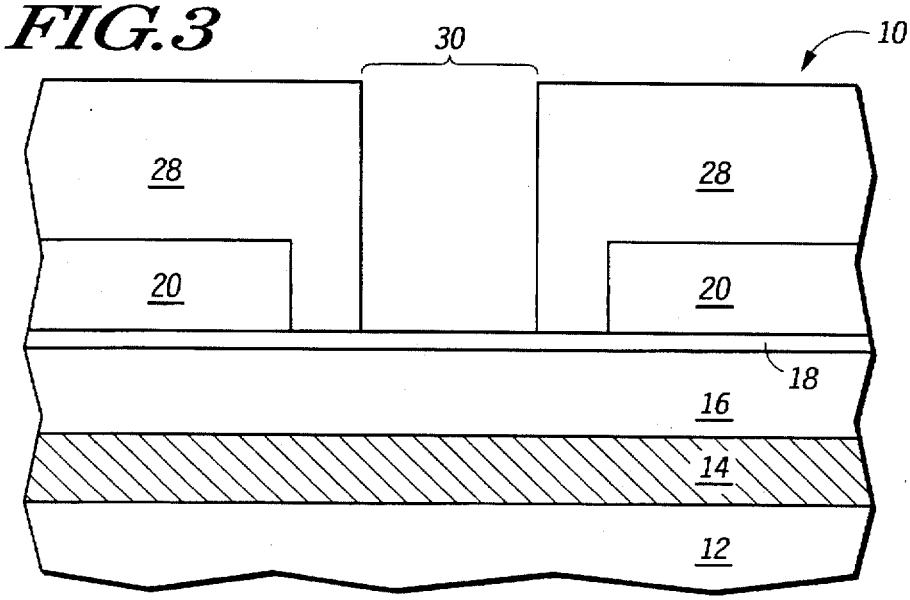

FIG. 3 illustrates that photoresist 28 is deposited overlying the second dielectric layer 20 and the dielectric tantalum nitride layer 18. A second masking and photolithographic process is used to expose the photoresist 28 to light wherein the anti-reflective dielectric tantalum nitride layer 18 is once again used to reduce the adverse effects of light reflection from the surface of conductive region 14 to improve the critical dimension control of openings formed through photoresist layer 28. FIG. 3 illustrates that the opening 30 formed through photoresist layer 28 has a width which is less than a width of the opening formed through photoresist layer 22 and second dielectric layer 20. This two-tier etch processing is typical when forming damascene contacts since the opening formed through layer 20 is used to provide an electrical interconnect portion of conductive material between two contact openings and the opening formed using opening 30 as used to form a one contact portion of the damascene electrical interconnect.

Figure 4:
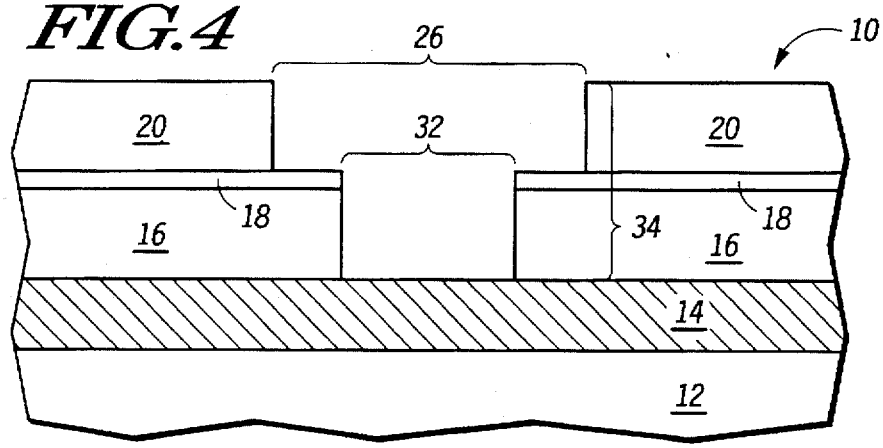

FIG. 4 illustrates that the opening 30 through the photoresist layer 28 is extended through the anti-reflective coating dielectric tantalum nitride layer 18 and the first dielectric layer 16 to expose a top surface of the conductive region 14. Therefore, the processing illustrated in FIGS. 2–4 result in a two tier contact having a first portion 26 and a second portion 32 wherein a width of the portion 26 is greater than a width of the portion 32 as illustrated in FIG. 4. In FIG. 4, the photoresist layer 28 is removed from a surface of a semiconductive structure 10.

Figure 5:
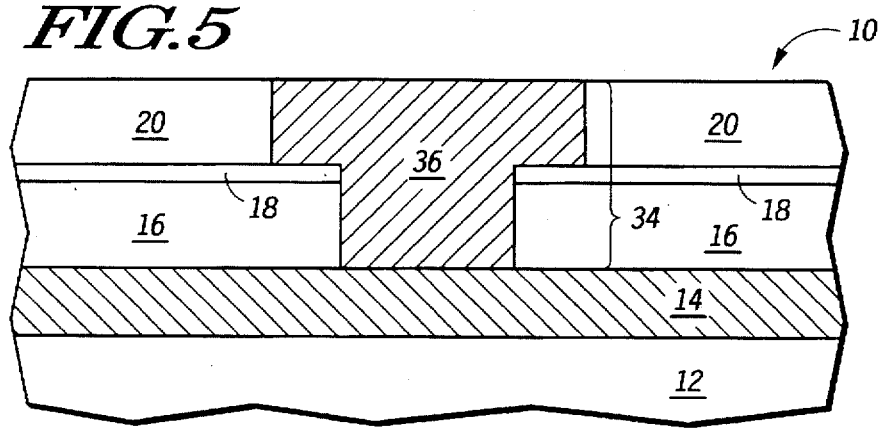

FIG. 5 illustrates that a conformal conductive layer is deposited overlying the semiconductor structure 10 and that this layer is chemically mechanically polished (CMP) or processed via resist etch back (REB) technology to form a planarized conductive plug 36 within the first portion 26 and second portion 32 of the opening formed via the processing illustrated in FIG. 4. It is important to note that since the layer 18 is a dielectric tantalum nitride layer, the layer 18 does not need to be isolated from any one of layer 14 or conductive plug 36 by dielectric spacers or additional deposition steps. Therefore, by using a dielectric tantalum nitride layer 18: (1) reflection from layer 14 is reduced to improve photoresist and photolithographic processing; (2) layer 18 is used as an etch stop to properly form damascene contacts; and (3) no additional processing steps are needed to deposit materials which isolate the conductive plug 36 from the layer 18 since the tantalum nitride layer 18 is nonconductive. Therefore, in summary, FIGS. 1–5 illustrate a method for forming an inter-metal damascene contact using a dielectric tantalum nitride layer 18 which is superior to that taught in the prior art.

Figure 6:
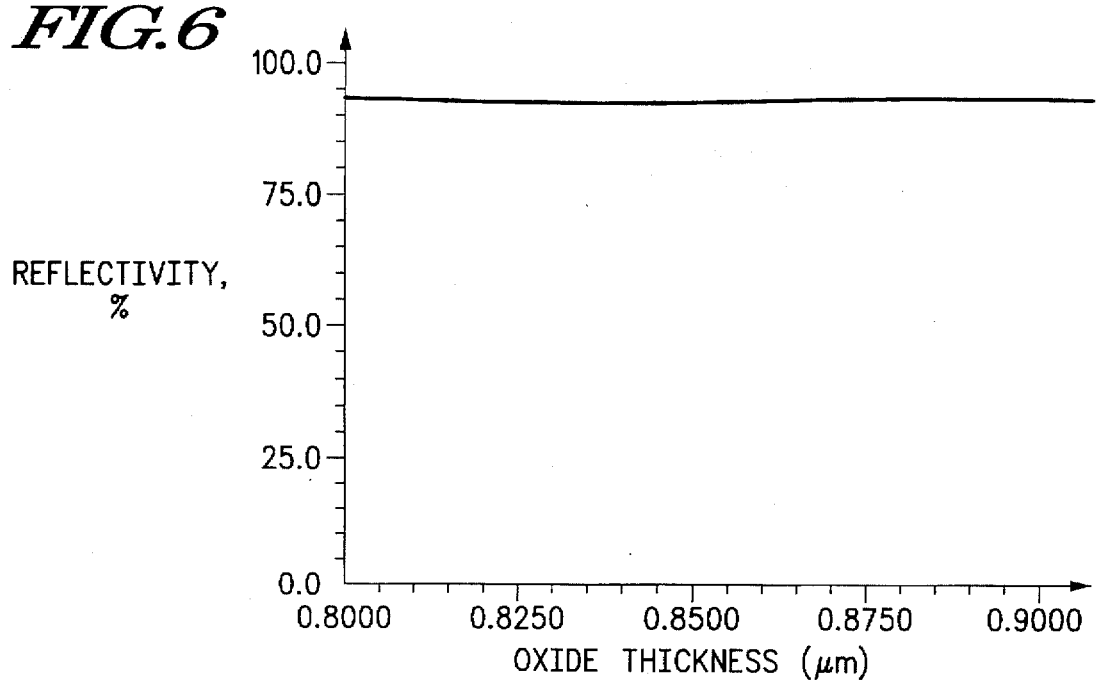
FIG. 6 is an x-y graph illustrating the reflectivity of a dual damascene structure without having an ARC layer present.

FIG. 6 illustrates, in an x-y plot, the percentage reflectivity of photolithographic light versus the thickness of the dielectric layer 16. FIG. 6 illustrates the reflectivity for light having a wavelength of 365 nanometers. It should be noted, however, that the reflectivity of nearly any wavelength of light and nearly any thickness of TEOS is going to be substantial in a manner similar to that illustrated in FIG. 6. FIG. 6 illustrates that when no ARC layer (like layer 18 taught herein) is placed onto a semiconductor substrate as illustrated in FIGS. 1–5, the reflectivity of light from the surface of conductive region 14 is roughly 90%. This reflected light may cause constructive or destructive interference during photolithographic processing which will render the critical dimensions (e.g. width) of contact openings to vary significantly. In addition, the reflected light may result in photoresists not being properly exposed to light and not being properly developed. When photoresist is not properly exposed to light, the yield of the semiconductor device may be decreased. Therefore, FIG. 6 illustrates the need for reducing light reflectivity from the layer 14 so that photoresist processing can be improved.

Figure 7:
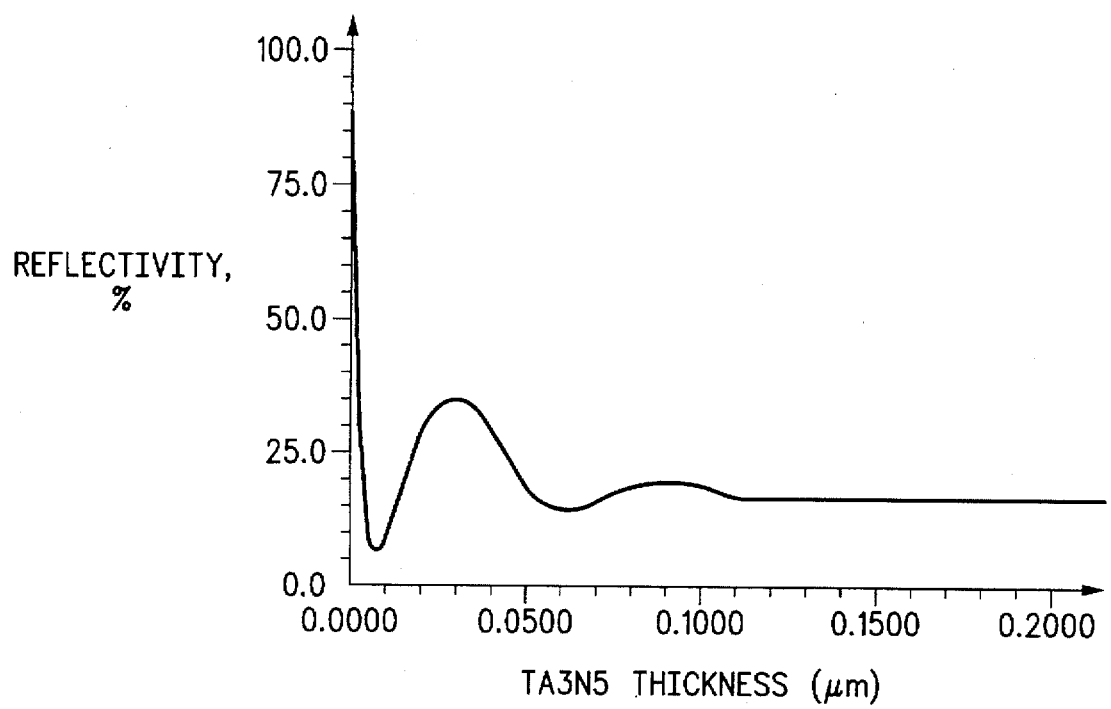
FIG. 7 is an x-y graph illustrating the reflectivity of the same dual damascene structure having a dielectric tantalum nitride layer used as an ARC between the first and second dielectric layers of the dual damascene structure.

FIG. 7 illustrates the reflectivity percentage from the surface of the conductive region 14 once the ARC dielectric tantalum nitride layer 18 is in place as illustrated in FIGS. 1–5. FIG. 7 clearly indicates that a dielectric tantalum nitride layer 18 when formed to a thickness of between 100 angstroms and roughly 800 angstroms can significantly reduce the reflectivity percentage of light from the surface of conductive layer 14. This significant reduction of reflected light results in a more controlled critical dimension process and a higher yield photoresist process than that previously available via the reflection illustrated in FIG. 6.

Figure 8:
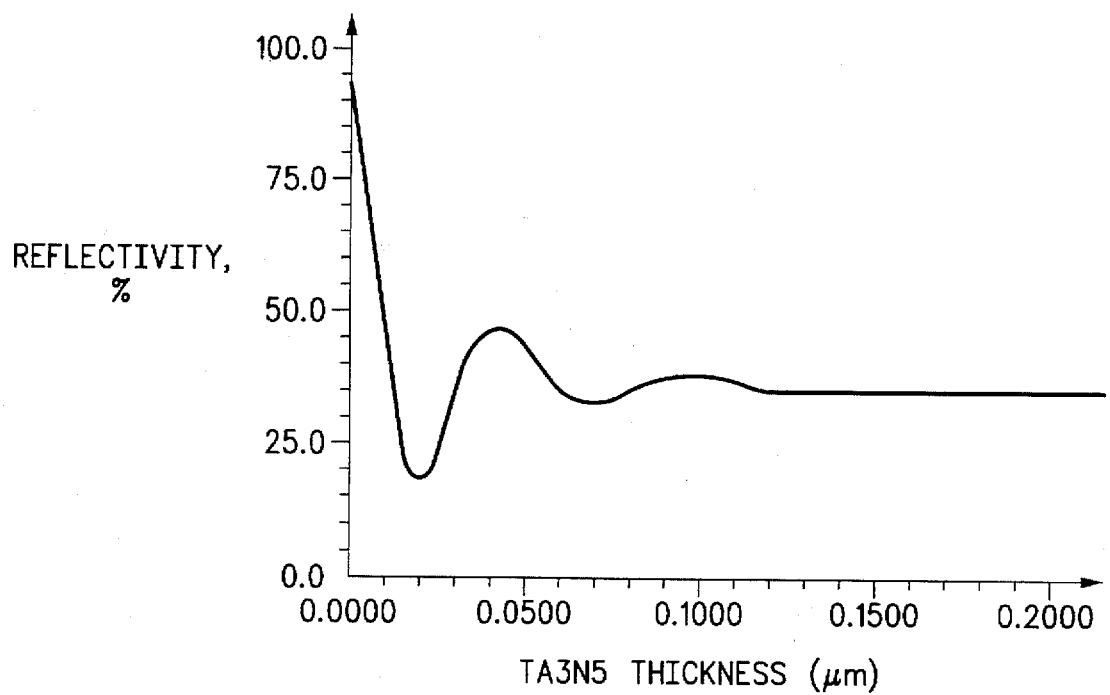
FIG. 8 is an x-y graph illustrating the reflectivity in the dual damascene structure wherein a dielectric tantalum nitride ARC is located between the first dielectric layer and the metal layer of the dual damascene structure.

FIG. 8 illustrates that the tantalum nitride layer 18 of FIGS. 1–5 may be positioned at the interface of layers 14 and 16 instead of between layers 16 and 20 as in FIG. 1 while still obtaining significant reflection reduction. In addition, the dielectric tantalum nitride layer also provides a diffusion barrier for metals such as copper which is known to diffuse easily through dielectric materials (TEOS and polyimide). Therefore, in an alternate embodiment, the layer 18 may be placed between the layer 14 and the layer 16 and not in between the layer 16 and the layer 20 as illustrated in FIG. 1. In yet another embodiment, the anti-reflective layer 18 may be placed between the second dielectric layer 20 and the photoresist layer 22. Experimentation has shown that this upper placement of the dielectric tantalum nitride layer 18 still results in significant reduction in light reflectivity similar to that indicated in FIGS. 7 and 8.

Figure 9:
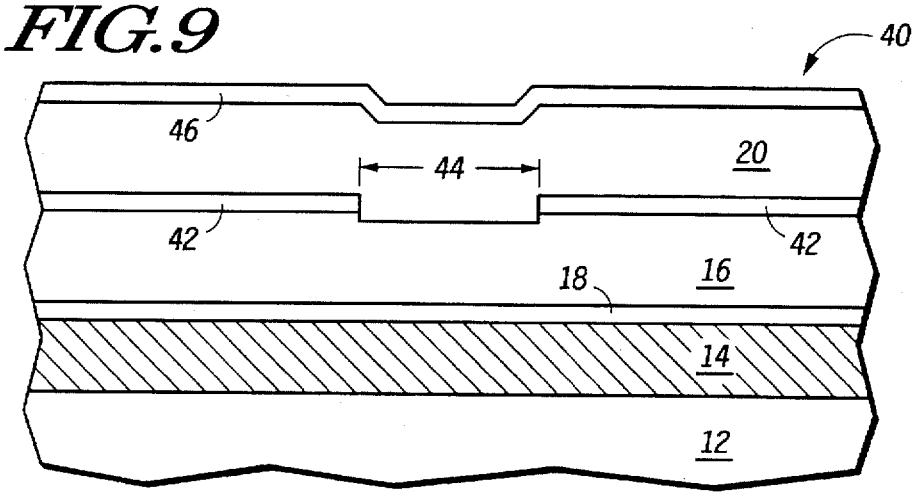
FIGS. 9–12 illustrate in cross-section a portion of a semiconductor device in which an ARC is used at the bottom

Given that the tantalum nitride dielectric layer 18 may be positioned at different places within the interlevel dielectric composite, FIGS. 9–12 illustrate and alternate embodiment. FIG. 9 illustrates a substrate 12 which is analogous to the substrate illustrated in FIG. 1. A conductive region 14 is deposited where conductive region 14 is analogous to the conductive region 14 of FIG. 1. The dielectric tantalum nitride layer 18 is deposited on top of the conductive region 14 as illustrated in FIG. 9. A dielectric layer 16 which is analogous to the dielectric layer 16 of FIG. 1 is then deposited overlying the dielectric tantalum nitride layer 18. A second etch stop layer or anti-reflective coating layer 42 is then deposited overlying the first dielectric layer 16. Layer 42 may be made of dielectric tantalum nitride ($Ta_3N_5$) or may be made of other dielectric anti-reflective coatings such as silicon rich silicon nitride. An opening 44 is etched through layer 42 using conventional photolithographic and etch processing.

After formation of the opening 44 as illustrated in FIG. 9, a second dielectric layer 20 is deposited overlying the opening 44 and the layer 42. Dielectric layer 20 in FIG. 9 is analogous to the dielectric layer 20 of FIG. 1. A polish stop layer 46 is then deposited overlying a top portion of the dielectric layer 20. The polish stop layer 46 may be formed from tantalum nitride ($Ta_3N_5$) or may be formed by any polish stop material which is suitable for stopping a chemical mechanical polishing (CMP) operation. It is important to note that any one layer, several layers, or all of the layers 18, 42, and 46 may be used to provide anti-reflective properties during the formation of the semiconductor structure 40.

Figure 10:
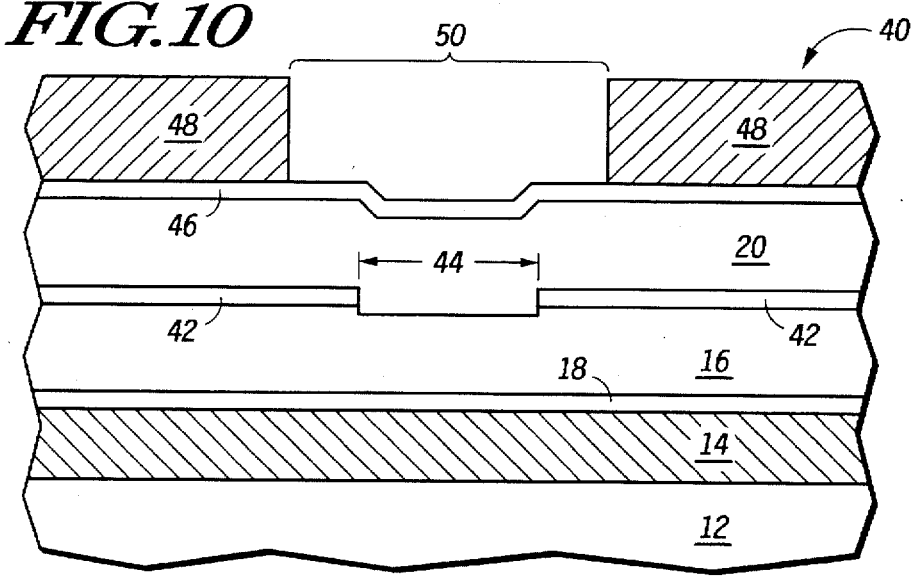

FIG. 10 illustrates that a photoresist layer 48 is formed over a top of the polish stop layer 46. The photoresist layer 48 of FIG. 10 is analogous to the photoresist layer 22 of FIG. 1. Therefore, the opening 24 of FIG. 1 is analogous to the opening 50 of FIG. 10. It is important to note that the opening 50 through the photoresist layer 48 has a width which is greater than a width of the opening 44 as illustrated in FIG. 10.

Figure 11:
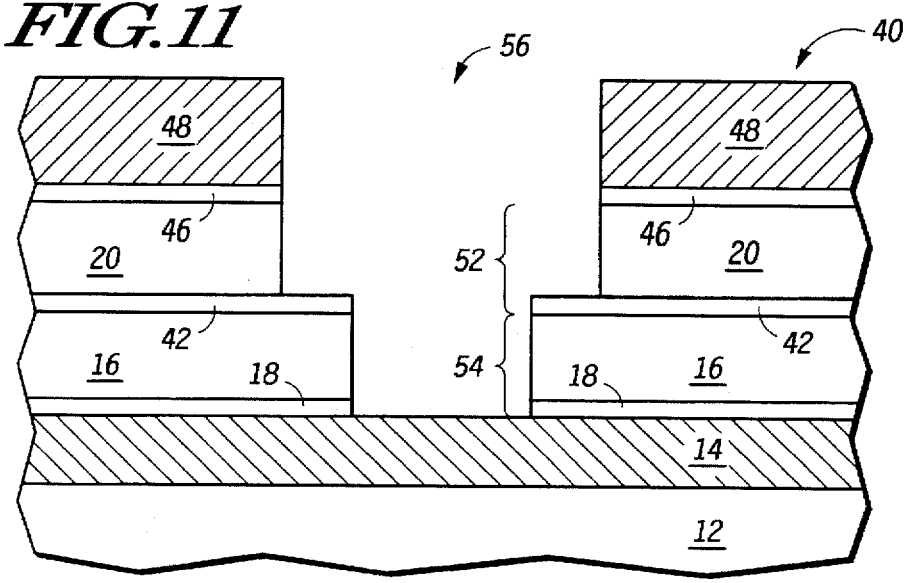

FIG. 11 illustrates that the polish stop layer 46 and the second dielectric layer 20 are etched by exposing the layers 46 and 20 to an etch chemistry. The etch chemistry used to etch the dielectric layer 20 is selective to the layer 42. Therefore, layer 42 will provide a self-alignment mechanism whereby the etch chemistry used to etch layers 20 and 16 will automatically, in a self-aligning manner, allow for the formation of a first opening portion 52 and a second opening portion 54. The first opening portion 52 has a width which is greater than the second opening portion 54 due to the smaller radius opening 44 of FIG. 10. Therefore, the final structure resulting in FIG. 11 is nearly identical to the structure illustrated in FIG. 4 with the exception of the additional layers 46 and 42 illustrated in FIG. 11.

Figure 12:
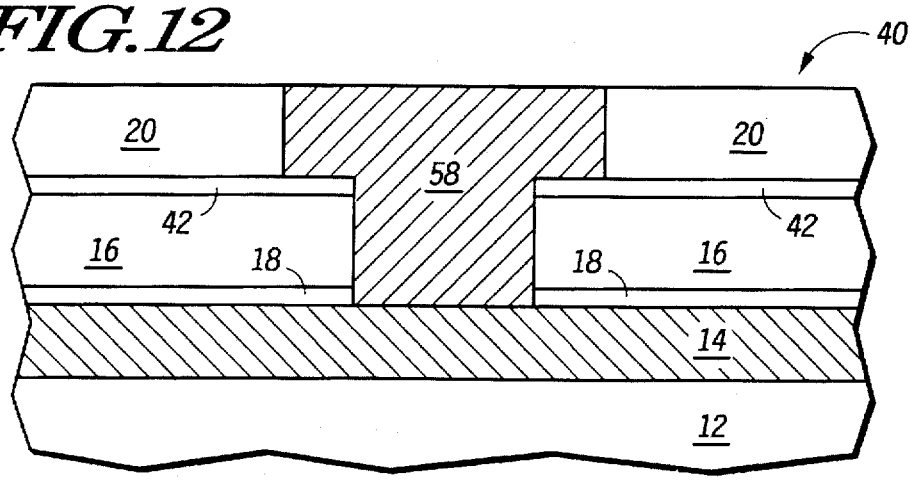

FIG. 12 illustrates that a conductive layer 58 is deposited and is chemical mechanically polished (CMPed) to form a conductive plug 58. Conductive plug 58 forms an electrical interconnect portion and an electrical contact portion which allows for electrical signals to be provided between conductive region 14 and other conductive portions of the substrate 12.

FIGS. 13–15 illustrate an alternative embodiment for forming a dual damascene opening 34 in accordance with another embodiment of the present invention. In this embodiment, rather than forming the larger portion of the dual damascene opening first as in FIGS. 1–5, the smaller portion of the opening is formed first. More specifically, in reference to FIG. 13, photoresist mask 60 is formed overlying substrate 12, conductive region 14, first dielectric layer 16, dielectric tantalum nitride layer 18, and second dielectric layer 20. An opening 62 is formed in photoresist mask 60, and the device is etched to form a first portion 64 of an opening through second dielectric layer 20 and dielectric tantalum nitride layer 18, as illustrated in FIG. 13. First portion 64 of the opening is used to define the smaller hole opening portion of the dual damascene structure. After forming first portion 64, another photoresist mask 66 is formed on the device and is patterned to include an opening 68, as illustrated in FIG. 14. Opening 68 will be used to define the larger portion of the damascene opening while also etching a smaller opening in the dielectric layer 16. An etch operation is used while photoresist mask 66 is in place to etch exposed portions of the second dielectric layer 20 and the dielectric tantalum nitride layer within opening 68. Further, the etch will expose portions of first dielectric layer 16 within first portion 64 of an opening to the same etch chemistry. Accordingly, the second etch step will simultaneously be etching the first and second dielectric layers to ultimately form damascene opening 34 which when finished is the same as that formed in reference to FIG. 14. Therefore, FIGS. 13–15 illustrate that there are a variety of processing sequences which may be used to form a damascene structure in accordance with the present invention, and that the choice of one of these methods over another when used in conjunction with a dielectric tantalum nitride ARC layer in accordance with the present invention is not restrictive.

Thus, it is apparent that there has been provided a method for providing a dielectric tantalum nitride layer to function as an anti-reflective coating (ARC) and/or an etch stop layer and/or a diffusion barrier in a semiconductor structure. Those skilled in the art will recognize that modifications and variations may be made to the teachings herein without departing from the spirit and scope of the invention. It should be noted that the absorption coefficient or extinction coefficient (K) of the dielectric tantalum nitride herein should be greater than 0.25 and preferably between 0.25 through 1.0 for an effective ARC layer. By using reactive ion sputtering to form the dielectric tantalum nitrite a K value within this K range. Therefore, it is intended that this invention encompass all such variations and modifications as fall within the scope of the appended claims.

We claim:

1. A method for forming a semiconductor structure, the method comprising the steps of:

forming a conductive region;

forming a dielectric tantalum nitride layer of the formula $Ta_3N_5$ overlying the conductive region;

depositing a photoresist layer overlying the tantalum nitride layer; and exposing the photoresist layer to light to molecularily alter a portion of the photoresist layer wherein the dielectric tantalum nitride layer attenuates light reflected from the conductive region so that the light reflected from the conductive region has a reduced effect on the portion of the photoresist layer which is molecularly altered.

2. The method of claim 1 wherein the step of forming the dielectric tantalum nitride layer comprises:

forming the dielectric tantalum nitride layer so that the dielectric tantalum nitride layer is in contact with the conductive region.

3. The method of claim 2 further comprising:

forming an oxide layer overlying the dielectric tantalum nitride layer where the oxide layer is in contact with both the dielectric tantalum nitride layer and the photoresist layer.

4. The method of claim 1 further comprising:

forming a first oxide layer underlying the dielectric tantalum nitride layer and overlying the conductive region; and forming a second oxide layer overlying the dielectric tantalum nitride layer, so that the dielectric tantalum nitride layer is located between the first oxide layer and the second oxide layer.

5. The method of claim 4 further comprising:

etching a first portion of an opening through the second oxide layer using the dielectric tantalum nitride layer as an etch stop layer.

6. The method of claim 5 further comprising:

etching a second portion of the opening through the dielectric tantalum nitride layer and the first oxide layer to form an opening which exposes the conductive region.

7. The method of claim 6 wherein the steps of etching comprise:

forming the first portion of the opening at a first width and a second portion of the opening at a second width wherein the first width is greater than the second width.

8. The method of claim 5 further comprising:

forming a conductive plug within the first and second portions of the opening to make electrical contact to the conductive region.

9. The method of claim 8 wherein the step of forming the conductive plug comprises:

forming a conductive plug so that the conductive plug is in contact with a portion of the dielectric tantalum nitride layer.

10. The method of claim 1 further comprising:

forming an oxide layer underlying the dielectric tantalum nitride layer and overlying the conductive region; and forming the dielectric tantalum nitride layer so that the dielectric tantalum nitride layer overlies the first oxide layer and is in contact with the photoresist layer.

11. The method of claim 1 wherein the step of exposing the photoresist layer to light further comprises:

phase shifting a frequency of the light reflected from the conductive region to perform said attenuating of light reflected from the conductive region, the phase shifting allowing the light reflected from the conductive region to have a reduced effect on the portion of the photoresist layer which is molecularly altered.

12. The method of claim 1 wherein the step of exposing the photoresist layer to light further comprises:

using a frequency of light within the range of 370 nm to 245 nm.

13. The method of claim 1 wherein the step of exposing the photoresist layer to light further comprises:

using light having a wavelength corresponding to the I-line of mercury.

14. The method of claim 1 wherein the step of exposing the photoresist layer to light further comprises:

using light having a wavelength corresponding to the G-line of mercury.

15. The method of claim 1 further comprising:

etching a portion of the dielectric tantalum nitride layer to form a portion of an opening wherein the opening exposes the conductive region, the etching being a plasma etch using a fluorine chemistry.

16. The method of claim 1 wherein the step of forming the conductive region comprises:

forming the conductive region from a material selected from the group consisting of: aluminum, copper, and tungsten.

17. A method for forming a semiconductor structure, the method comprising the steps of:

forming a conductive region;

forming a first dielectric layer overlying the conductive region;

forming a tantalum nitride anti-reflective coating (ARC) layer of the formula $Ta_3N_5$ overlying the first dielectric layer;

forming a second dielectric layer overlying the ARC layer;

forming a first photoresist layer overlying the second dielectric layer;

exposing the first photoresist layer to light having a wavelength within the range of 440 nm to 245 nm to molecularly alter a portion of the first photoresist layer wherein the ARC layer attenuates light reflected from the conductive region so that the light reflected from the conductive region has a reduced effect on the portion of the first photoresist layer which is molecularly altered;

etching a first portion of an opening through the second dielectric layer wherein the first portion has a first width and wherein the ARC layer is used as an etch stop layer when forming the first portion of the opening;

depositing a second photoresist layer overlying the ARC layer;

exposing the second photoresist layer to light having a wavelength within the range of 440 nm to 245 nm to molecularly alter a portion of the second photoresist layer wherein the ARC layer attenuates light reflected from the conductive region so that the light reflected from the conductive region has a reduced effect on the portion of the second photoresist layer which is molecularly altered;

etching a second portion of the opening through the first dielectric layer and the ARC layer wherein the second portion has a second width which is less than the first width;

depositing a metal layer so that the metal layer fills the first and second portions of the opening; and planarizing the metal layer so that the metal layer forms an electrical interconnect which is electrically coupled to the conductive region.

18. The method of claim 17 wherein the step of depositing a metal layer comprises:

depositing the metal layer so that the metal layer is in contact with the ARC layer.

19. The method of claim 17 further comprising:

removing the first photoresist layer before depositing the second photoresist layer.

20. The method of claim 17 further comprising:

forming the first dielectric layer as a tetraethylorthosilicate (TEOS) material.

21. The method of claim 20 further comprising:

forming the second dielectric layer as a tetraethylorthosilicate (TEOS) material.

22. A method for forming a semiconductor structure, the method comprising the steps of:

forming a conductive region;

forming a first anti-reflective coating (ARC) layer overlying the conductive region;

forming a first dielectric layer overlying the first ARC layer;

forming a second anti-reflective coating layer overlying the first dielectric layer;

forming a first photoresist layer overlying the second ARC layer;

exposing the first photoresist layer to light to molecularly alter a portion of the first photoresist layer overlying the ARC opening wherein one of either the first or second ARC layer attenuates light reflected from the conductive region so that the light reflected from the conductive region has a reduced effect on the portion of the first photoresist layer which is molecularly altered;

developing the portion of the first photoresist layer to remove the portion of the first photoresist layer;

etching an ARC opening through the second ARC layer;

forming a second dielectric layer overlying the ARC layer;

forming a second photoresist layer overlying the second dielectric layer;

exposing the second photoresist layer to light to molecularly alter a portion of the second photoresist layer overlying the ARC opening wherein one of either the first or second ARC layer attenuates light reflected from the conductive region so that the light reflected from the conductive region has a reduced effect on the portion of the second photoresist layer which is molecularly altered;

developing the portion of the second photoresist layer to remove the portion of the second photoresist layer;

etching a contact opening through the first and second dielectric layer using the ARC opening as a self-aligning opening so that a first portion of the contact opening formed through the first dielectric layer has a width which is less than a width of a second portion of the contact opening formed through the second dielectric layer;

depositing a metal layer so that the metal layer fills the first and second portions of the contact opening; and planarizing the metal layer so that the metal layer forms an electrical interconnect which is electrically coupled to the conductive region wherein at least one of either the first or second ARC layer is made of tantalum nitride of the formula $Ta_3N_5$.

23. The method of claim 22 further comprising:

forming a polish stop layer overlying the second dielectric layer wherein the polish stop layer is used to polish stop a chemical mechanical polishing step used in the step of planarizing the metal layer.

24. The method of claim 22 wherein step of forming the first ARC layer comprises:

forming the first ARC layer as a dielectric tantalum nitride anti-reflective coating layer of the formula $Ta_3N_5$.

25. The method of claim 22 wherein step of forming the second ARC layer comprises:

forming the second ARC layer as a dielectric tantalum nitride anti-reflective coating layer of the formula $Ta_3N_5$.

26. A method for forming a semiconductor structure, the method comprising the steps of:

providing a conductive layer;

forming a first dielectric layer overlying the conductive layer;

forming a tantalum nitride dielectric layer overlying the first dielectric layer, the tantalum nitride dielectric layer being of the formula $Ta_3N_5$;

forming a second dielectric layer overlying the tantalum nitride dielectric layer; and using the tantalum nitride dielectric layer as a anti-reflective coating (ARC) layer and an etch stop layer to form a contact opening which exposes the conductive layer, the contact opening having a first portion having a first width and a second portion having a second width wherein the first width is different from the second width.

27. A method for forming a semiconductor structure, the method comprising the steps of:

providing a conductive layer;

forming a first etch stop layer overlying the conductive layer, the first etch stop layer having anti-reflective properties;

forming a first dielectric layer overlying the first etch stop layer;

forming a second etch stop layer overlying the first dielectric layer, the second etch stop layer having anti-reflective properties;

forming a second dielectric layer overlying the second etch stop layer;

forming a third etch stop layer overlying the second dielectric layer, the third etch stop layer having anti-reflective properties, wherein one of the first, second, or third etch stop layers is a layer of tantalum nitride of the formula $Ta_3N_5$;

forming a dual inlaid metallic interconnect structure by etching openings through the first, second, and third etch stop layers and filling the openings with a metallic material.

* * * * *